United States Patent
Yao et al.

(10) Patent No.: US 11,385,555 B2
(45) Date of Patent: Jul. 12, 2022

(54) SEMICONDUCTOR MANUFACTURING SYSTEM AND PARTICLE REMOVAL METHOD

(71) Applicant: Taiwan Semiconductor Manufacturing Co., Ltd., Hsinchu (TW)

(72) Inventors: Chih-Yuan Yao, Hsinchu (TW); Yu-Yu Chen, Taichung (TW); Hsiang-Lung Tsou, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/867,762

(22) Filed: May 6, 2020

(65) Prior Publication Data

US 2021/0349405 A1 Nov. 11, 2021

(51) Int. Cl.
*G03F 7/20* (2006.01)
*B08B 5/00* (2006.01)
*B08B 6/00* (2006.01)

(52) U.S. Cl.
CPC .......... *G03F 7/70741* (2013.01); *B08B 5/00* (2013.01); *B08B 6/00* (2013.01)

(58) Field of Classification Search
None
See application file for complete search history.

(56) References Cited

U.S. PATENT DOCUMENTS

| 6,344,301 B1 * | 2/2002 | Akutsu | C25D 13/04 |
| | | | 257/59 |
| 2010/0288302 A1 * | 11/2010 | Ehm | B08B 5/02 |
| | | | 134/1.1 |

\* cited by examiner

*Primary Examiner* — Eric W Golightly
(74) *Attorney, Agent, or Firm* — McClure, Qualey & Rodack, LLP

(57) ABSTRACT

A particle removal method includes loading a particle attracting member with a coating layer into a processing chamber of a processing apparatus. The method also includes fixing the particle attracting member on a holder in the processing chamber in a cleaning cycle. The method also includes attracting particles in the processing chamber by the coating layer of the particle attracting member due to a potential difference between the particles and the coating layer. The particles are attracted to the surface of the coating layer. The method further includes loading the particle attracting member with the coating layer and the attracted particles out of the processing chamber, after the cleaning cycle. In addition, the method includes loading a semiconductor wafer into the processing chamber, and performing a semiconductor process on the semiconductor wafer in the processing chamber. The semiconductor process is performed after the cleaning cycle.

20 Claims, 8 Drawing Sheets

SEMICONDUCTOR MANUFACTURING SYSTEM AND PARTICLE REMOVAL METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel target droplets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for the lithography process have been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
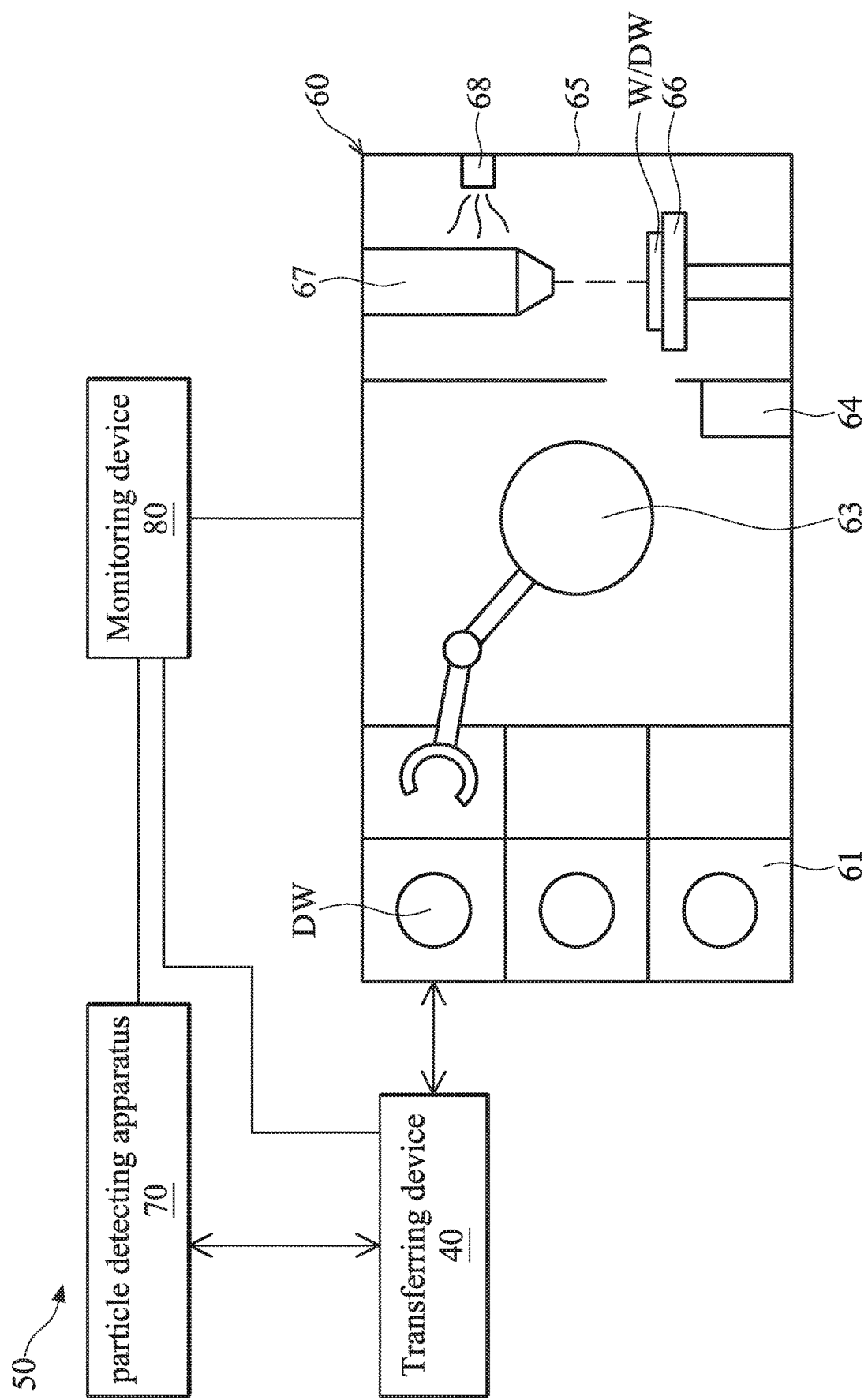
FIG. 1 shows a diagram of a semiconductor manufacturing system according to some embodiments of the present disclosure.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is generally related to a semiconductor manufacturing system and particle removal methods. More particularly, it is related to system and methods for effectively removing particles from the processing chamber of the semiconductor manufacturing system. One challenge in existing semiconductor manufacturing system is low efficiency for removing particles from the processing chamber and the fact that they take too much time. Therefore, an object of the present disclosure is to minimize the time required to remove particles from the processing chamber, thereby improving the production yield of the semiconductor process. Another challenge is that particles in the processing chamber may be easily concentrated on some module or members. Accordingly, another object of the present disclosure is to enhance local cleaning capabilities of the semiconductor manufacturing system.

Please refer to FIG. 1, which shows a diagram of a semiconductor manufacturing system 50 according to some embodiments of the present disclosure. As shown in FIG. 1, the semiconductor manufacturing system 50 includes a semiconductor processing apparatus 60 and a monitoring device 80. In this embodiment, the semiconductor processing apparatus 60 is a scanning electron microscope (SEM), but it is not limited thereto. For example, the semiconductor processing apparatus 60 can be a critical-dimension scanning electron microscope (CD-SEM), a review-SEM, an EUV scanner, an etching process apparatus or another applicable processing apparatus, in some other embodiments.

As shown in FIG. 1 the semiconductor processing apparatus 60 includes one or more loading ports 61, a transferring module 63, a vacuum device 64, and a processing chamber 65. It should be understood that the elements of the semiconductor processing apparatus 60 can be added or omitted in different embodiments, and the invention should not be limited by the embodiments.

One or more semiconductor wafers W are loaded into and out of the semiconductor processing apparatus 60 through the loading ports 61. In some embodiments, the semiconductor wafer W arrives at one loading port 61 contained in a transport carrier (not shown) such as a front-opening unified pod (FOUP), a front-opening shipping box (FOSB), a standard mechanical interface (SMIF) pod, and/or another suitable container. The transport carrier is a magazine for holding one or more semiconductor wafers W and for transporting semiconductor wafers W between different manufacturing tools or working stations. The transport carrier is sealed in order to provide a microenvironment for the semiconductor wafers W contained within and to protect the semiconductor wafers W and the semiconductor processing apparatus 60 against contamination. After being processed in the processing chamber 65 (which will be described later), the semiconductor wafers W may be transferred into another transport carrier for the processed semiconductor wafers W, which will be transported to the next processing system or inspection station.

The transferring module 63 is configured to transfer the semiconductor wafers W between the loading ports 61 and the processing chamber 65. In some embodiments, the transferring module 63 is disposed in a transferring chamber connecting to the loading ports 61 and connecting to the processing chamber 65, as shown in FIG. 1. This configuration allows the transferring module 63 to transfer the semiconductor wafers W between the loading ports 61 and the processing chamber 65. In some embodiments, the transferring module 63 includes a robotic arm for holding and transferring the semiconductor wafers W.

The processing chamber 65 is configured to perform a specific process on the semiconductor wafers W. The process may include a deposition process such as physical vapor deposition (PVD), chemical vapor deposition (CVD), plasma-enhanced chemical vapor deposition (PECVD), electrochemical deposition (ECD), molecular beam epitaxy (MBE), atomic layer deposition (ALD) or the like; an etching process including wet and dry etching and ion beam milling; a lithographic exposure process; an ion implantation process; a thermal process such as annealing and/or thermal oxidation; a cleaning process such as rinsing and/or plasma ashing; a chemical mechanical polishing or chemical mechanical planarizing (collectively "CMP") process; testing; any procedure involved in the processing of the substrate W; and/or any combination thereof.

The semiconductor processing apparatus 60 further includes a wafer holder 66 disposed in the processing chamber 65, in some embodiments as shown in FIG. 1. The wafer holder 66 is configured to hold the semiconductor wafer W during processing. The wafer holder 66 can be an electrostatic chuck (e-chuck) that can secure the semiconductor wafer W using electrostatic force, but it is not limited thereto. For example, the wafer holder 66 may alternatively use mechanical, vacuum, or other clamping techniques to secure the semiconductor wafer W. In some embodiments, a driving mechanism (not shown) may further be coupled to the wafer holder 66 and configured to drive the wafer holder 66 and the semiconductor wafer W thereon to rotate along a rotation axis. Accordingly, the semiconductor wafer W is rotated during processing. However, the semiconductor wafer W may be not rotated (i.e., static) during processing, in different embodiments.

The vacuum device 64 is configured to keep the processing chamber 65 in a vacuum state during processing. In some embodiments, the vacuum device 64 is an exhaust pump connecting to the processing chamber 65. Although not shown, the semiconductor processing apparatus 60 may further include a load lock chamber disposed between the chamber of the transferring module 63 and the processing chamber 65, in accordance with some embodiments. The load lock chamber is capable of creating an atmosphere compatible with the transferring chamber or the processing chamber 65 depending on where the loaded semiconductor wafer W is scheduled to be next. Accordingly, the atmosphere within the transferring chamber and the processing chamber 65 can be preserved, and the time required for achieving the ideal atmosphere in those chambers is reduced. The load lock chamber also includes an exhaust pump or other suitable means for adjusting the load lock chamber atmosphere.

As shown in FIG. 1, the semiconductor processing apparatus 60 further includes an electron-beam inspection module 67 disposed in the processing chamber 65, in accordance with some embodiments. When a semiconductor wafer W is fixed on the wafer holder 66, the electron-beam inspection module 67 performs an inspection of the semiconductor wafer W, such as a CD-SEM inspection, controlled by a monitoring device 80 (which will be described later).

In the present embodiment, the semiconductor wafer W may be made of silicon or another semiconductor material. Alternatively or additionally, the semiconductor wafer W may include other elementary semiconductor materials such as germanium (Ge). In some embodiments, the semiconductor wafer W is made of a compound semiconductor such as silicon carbide (SiC), gallium arsenic (GaAs), indium arsenide (InAs), or indium phosphide (InP). In some embodiments, the semiconductor wafer W is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer W may be a silicon-on-insulator (SOI) or a germanium-on-insulator (GOI) substrate.

In addition, the semiconductor wafer W may have various device elements. Examples of device elements that are formed in the semiconductor wafer W include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

It has been found that particles existing within the processing chamber 65 will adversely affect the yield rate of the semiconductor wafers W after processed. For example, particles may fall on the surface of the semiconductor wafer W disposed in the processing chamber 65 during processing, causing defects on the processed semiconductor wafer W. Therefore, it is desirable to effectively remove particles from the processing chamber 65 before sending the semiconductor wafer(s) W into the processing chamber 65 for processing. To this end, before the semiconductor wafer(s) W is placed into the processing chamber 65, the semiconductor processing apparatus 60 may further utilize a particle attracting member to remove particles from the processing chamber 65, in accordance with some embodiments as shown in FIG. 2.

Figure 2:
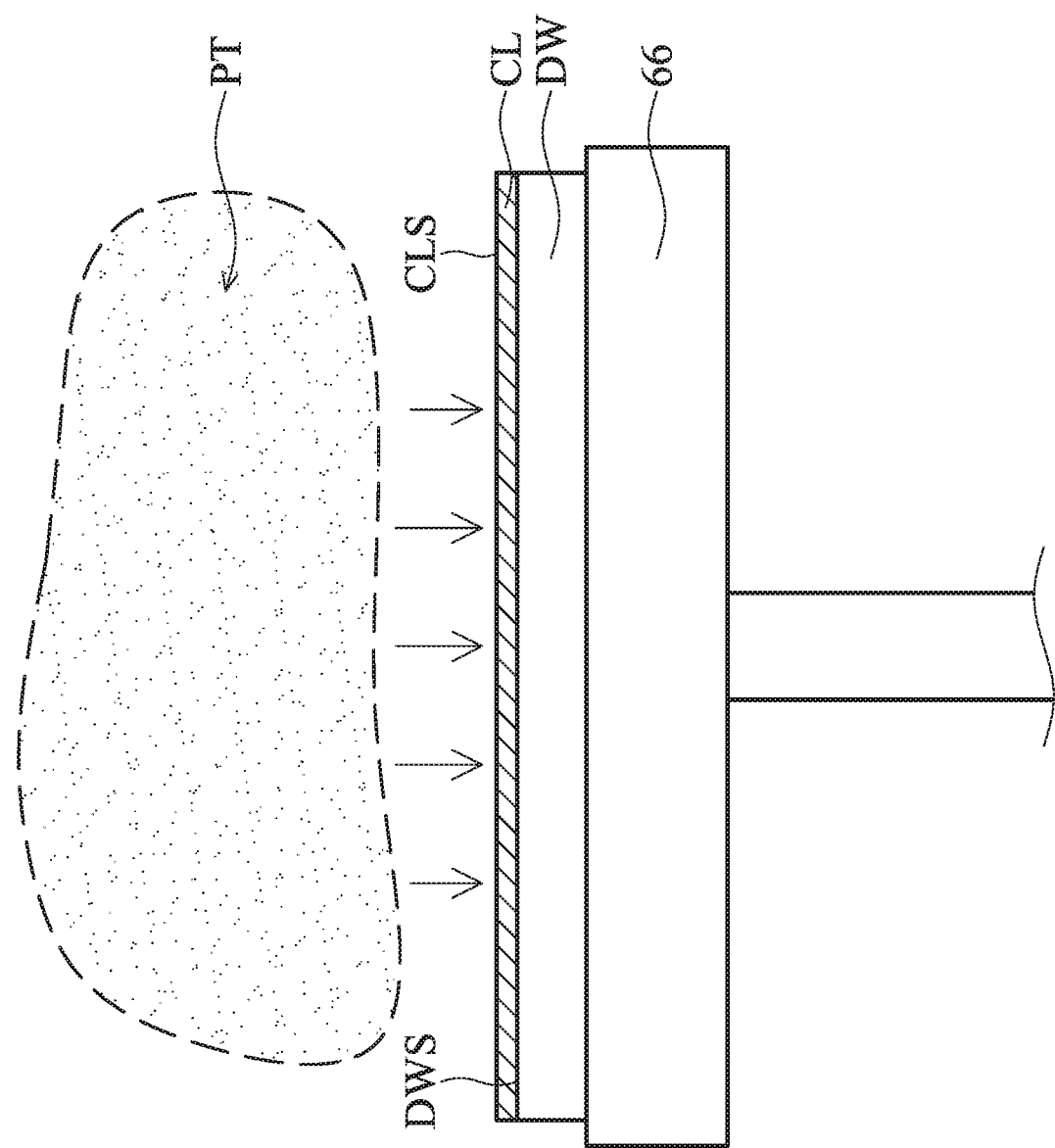
FIG. 2 is an enlarged diagram of the wafer holder and a particle attracting member according to some embodiments of the present disclosure.

FIG. 2 is an enlarged diagram of the wafer holder 66 and a particle attracting member DW according to some embodiments of the present disclosure. It should be appreciated that the particle attracting member DW may be loaded or transferred into and out of the semiconductor processing apparatus 60 shown in FIG. 1 (as well as the processing chamber 65) in a similar manner to the semiconductor wafer W described above. In these embodiments as shown in FIG. 2, the particle attracting member DW has a disc-shaped structure similar to the semiconductor wafer W. In addition, a thin film such as a coating layer CL for attracting particles (which will be described later) is formed on a surface DWS of the particle attracting member DW. The coating layer CL of the particle attracting member DW has a planar top surface CLS and a cross-sectional shape (in top view) that matches the particle attracting member DW. However, the particle attracting member DW (and the coating layer CL thereon) may have a different shape from the semiconductor wafer W in top view. For example, the particle attracting member DW (and the coating layer CL thereon) may be rectangular, square, triangular or any other suitable shape in different cases, as long as the wafer holder 66 can firmly secure the particle attracting member DW. The coating layer CL may include a Titanium dioxide (TiO2) film, an Oxide thin film or a Nitric thin film, but it is not limited thereto.

When the particle attracting member DW is transferred into the processing chamber 65 and placed on the wafer holder 66, no processing is performed on the particle attracting member DW, as opposed to performing a specific process on the semiconductor wafers W in the processing chamber 65 described above. For example, in some embodiments as shown in FIG. 1, when the particle attracting member DW is fixed on the wafer holder 66, the monitoring device 80 controls the electron-beam inspection module 67 not to perform the inspection on the particle attracting member DW.

In some embodiments, to attract particles in the processing chamber 65 the particle attracting member DW is fixed on the wafer holder 66 for a period of time, such as about two seconds to about one hour (i.e., 3600 seconds), while the processing chamber 65 is in the vacuum state (e.g., caused by the vacuum device 64). During the period of time, as shown in FIG. 2, some particles PT with a first potential in the processing chamber 65 are attracted by the coating layer CL with a second potential due to a potential difference between the coating layer CL and the particles PT. In some embodiments, the coating layer CL includes a Titanium dioxide (TiO2) film, an Oxide thin film or a Nitric thin film, such that the first potential is higher than the second potential, but it is not limited thereto. In some embodiments, the potential difference between the coating layer CL and the particles PT may be greater than about 0.3 electron-volts (EV), such as 0.45 EV, but it is not limited. In some embodiments, the particles PT are attracted onto the top surface CLS of the coating layer CL but do not enter the coating layer CL. That is, there is no chemical reaction between the particles PT and the coating layer CL.

After that, the particle attracting member DW with the particles PT attracted may be removed from the semiconductor processing apparatus 60. Accordingly, the particles PT in the processing chamber 65 can be removed by the particle attracting member DW. Based on the above design of the particle attracting member DW, the processing chamber 65 can be easily cleaned by the particle attracting member DW without shutting down the semiconductor processing apparatus 60 to allow the operator to manually clean the processing chamber 65. Consequently, the time required for removing the particles PT from the processing chamber 65 can be greatly reduced. For example, the time it takes for removing the particles PT can be reduced from about 72 hours to about 1 hour or less using the particle attracting member DW, in some embodiments. Moreover, because there are fewer human operations involving the cleaning of the semiconductor processing apparatus 60, the maintenance costs and the possibility of defects of the semiconductor wafers W can be reduced.

In some embodiments, as shown in FIG. 1, the semiconductor processing apparatus 60 further includes an airflow device 68 disposed in the processing chamber 65. The airflow device 68 may be disposed at any suitable place in the processing chamber 65 in order to enhance local cleaning capabilities of the processing chamber 65 by providing airflow. For example, in some embodiments as shown in FIG. 1, when the particle attracting member DW is fixed on the wafer holder 66 for cleaning the processing chamber 65, the airflow device 68 can provide airflow to the electron-beam inspection module 67, and the increased airflow loosens the particles that accumulate or adhere to the electron-beam inspection module 67, causing them to fall on the particle attracting member DW, which will be removed from the processing chamber 65 later. As a result, the effect of cleaning the electron-beam inspection module 67 is achieved, and the cleanliness of the entire processing chamber 65 is also improved.

In some embodiments, as shown in FIG. 1, the semiconductor manufacturing system 50 may further include a transferring device 40 and a particle detecting apparatus 70. The transferring device 40 is configured to transfer the particle attracting member DW between the particle detecting apparatus 70 and the semiconductor processing apparatus 60. In some embodiments, the particle attracting member DW is received in a closable container like the transport carrier for the semiconductor wafers W described above during transferring between the particle detecting apparatus 70 and the semiconductor processing apparatus 60. The transferring device 40 may include, for example, an automatic guided vehicle (AGV), a personal guided vehicle (PGV), a rail guided vehicle (RGV), an overhead shuttle (OHS), an overhead hoist transport (OHT) or another applicable transferring device.

The particle detecting apparatus 70 is configured to detect the number of particles on the particle attracting member DW. In some embodiments, the particle detecting apparatus 70 is an optical inspection instrument including at least on loading port, a transferring module, a light detection module (including a light emitter and light receiver), and a detection platform. After the container receiving the particle attracting member DW arrives the loading port of the particle detecting apparatus 70, the particle attracting member DW may be transferred to the detection platform via the transferring module. The loading port and the transferring module of the particle detecting apparatus 70 may be similar or the same as the loading port 61 and the transferring module 63 illustrated in FIG. 1, and the description is not repeated herein. When the particle attracting member DW is placed on the detection platform, the light emitter of the light detection module can emit light scanning across the surface of the particle attracting member DW (e.g., the top surface CLS of the coating layer CL), and the light receiver of the light detection module can receive the reflected light. Accordingly, the number of particles on the particle attracting member DW is obtained using optical detection. However, other particle detection or counting methods known in the art can also be used.

The monitoring device 80 can determine whether to control the transferring device 40 to transfer the particle attracting member DW to the semiconductor processing apparatus 60 (for cleaning the processing chamber 65) again or not according the detecting result of the particle detecting apparatus 70. A detailed description about controlling the operation of the transferring device 40 by the monitoring device 80 will be described later.

In this embodiment, the monitoring device 80 may be a computer system. In one example, the computer system includes a processor and a system memory component. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor.

Figure 3B:
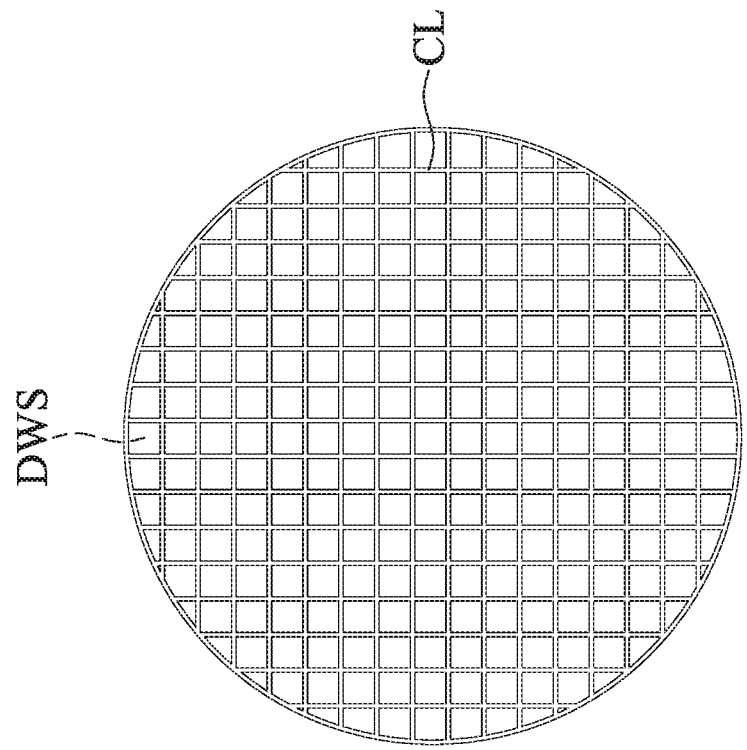
FIG. 3B shows a top view of the particle attracting member according to some embodiments of the present disclosure.
Figure 3A:
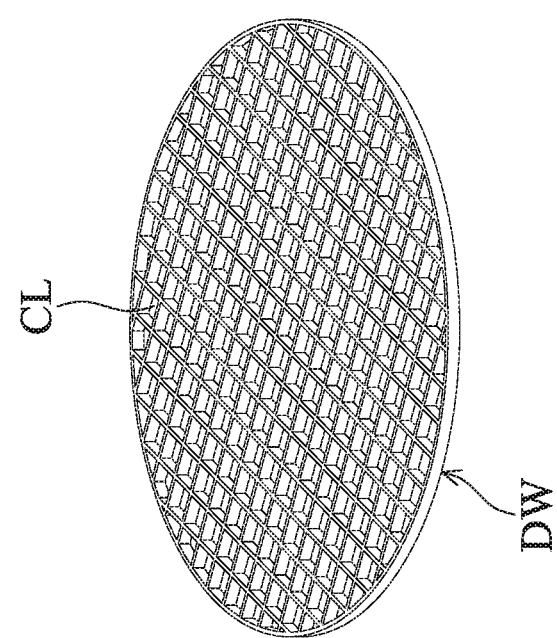
FIG. 3A is a schematic diagram of the particle attracting member according to some embodiments of the present disclosure.

Please refer to FIG. 3A and FIG. 3B. FIG. 3A is a schematic diagram of the particle attracting member DW according to some embodiments of the present disclosure, and FIG. 3B shows a top view of the particle attracting member DW in FIG. 3A. In these embodiments, the coating layer CL has some convex structures, such as walls, and the walls intersect with each other. As shown in FIG. 3B, when viewed in a direction perpendicular to the surface DWS of the particle attracting member DW, the convex structures form a lattice pattern.

Figure 4B:
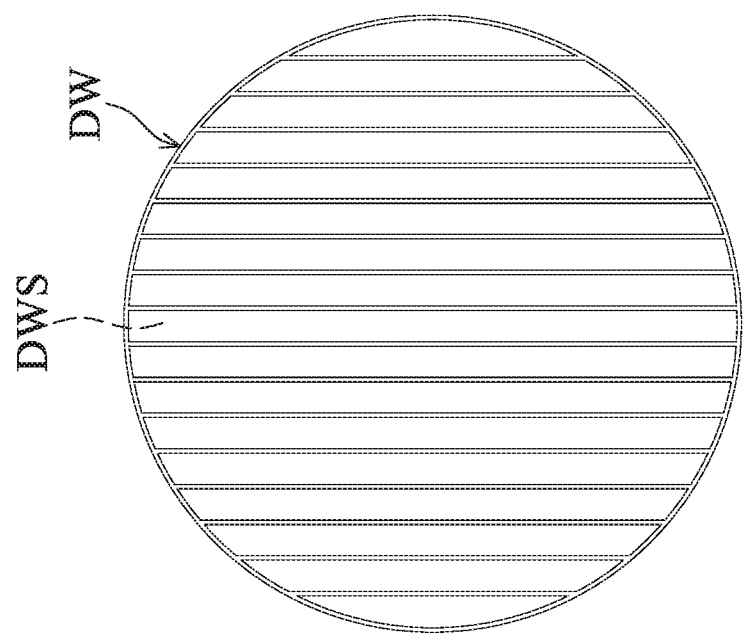
FIG. 4B shows a top view of the particle attracting member according to some embodiments of the present disclosure.
Figure 4A:
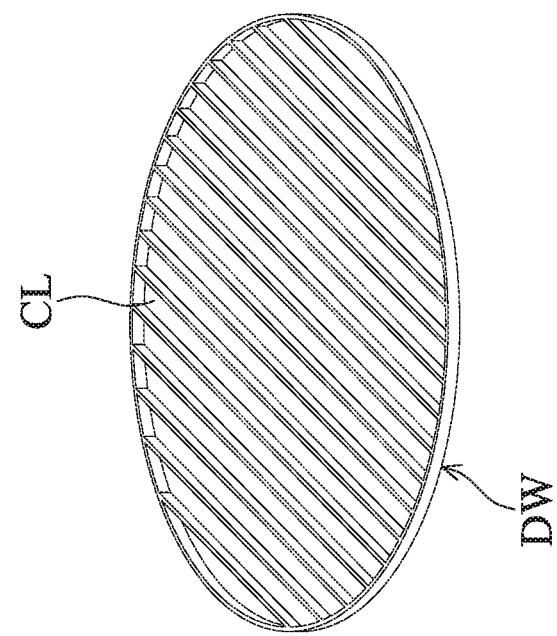
FIG. 4A is a schematic diagram of the particle attracting member according to some embodiments of the present disclosure.

Please refer to FIG. 4A and FIG. 4B. FIG. 4A is a schematic diagram of the particle attracting member DW according to some embodiments of the present disclosure, and FIG. 4B shows a top view of the particle attracting member DW in FIG. 4A. In these embodiments, the coating layer CL has some convex structures, such as fins, and the fins are parallel to each other. As shown in FIG. 4B, when viewed in a direction perpendicular to the surface DWS of the particle attracting member DW, the convex structures form a line pattern.

Figure 5C:
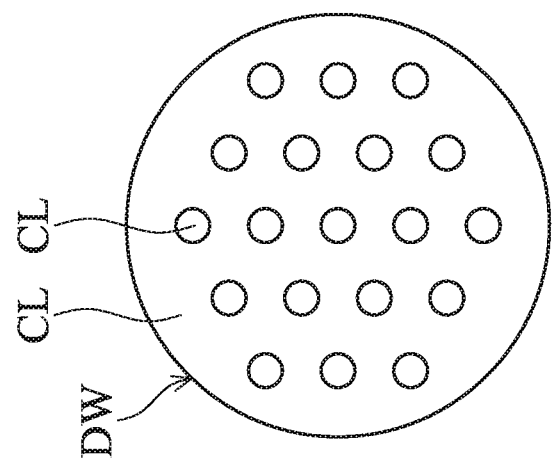
FIG. 5A to FIG. 5C respectively show a top view of the coating layer on the particle attracting member according to other embodiments of the present disclosure.
Figure 5B:
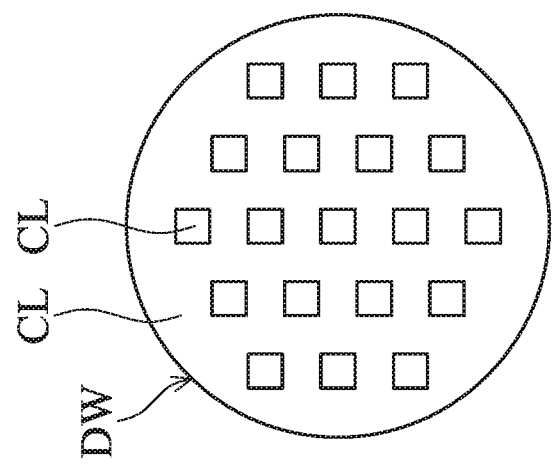
Figure 5A:
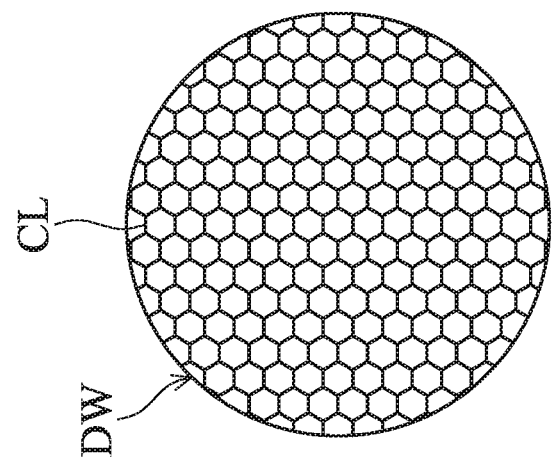

Please refer to FIG. 5A to FIG. 5C, which respectively show a top view of the coating layer CL on the particle attracting member DW according to other embodiments of the present disclosure. As shown in FIG. 5A, the convex structures form a honeycomb pattern. As shown in FIG. 5B, the convex structures form a rectangular pattern, and each of the convex structures may be a square pillar. As shown in FIG. 5C, the convex structures form a circular pattern, and each of the convex structures may be a cylinder.

Figure 6:
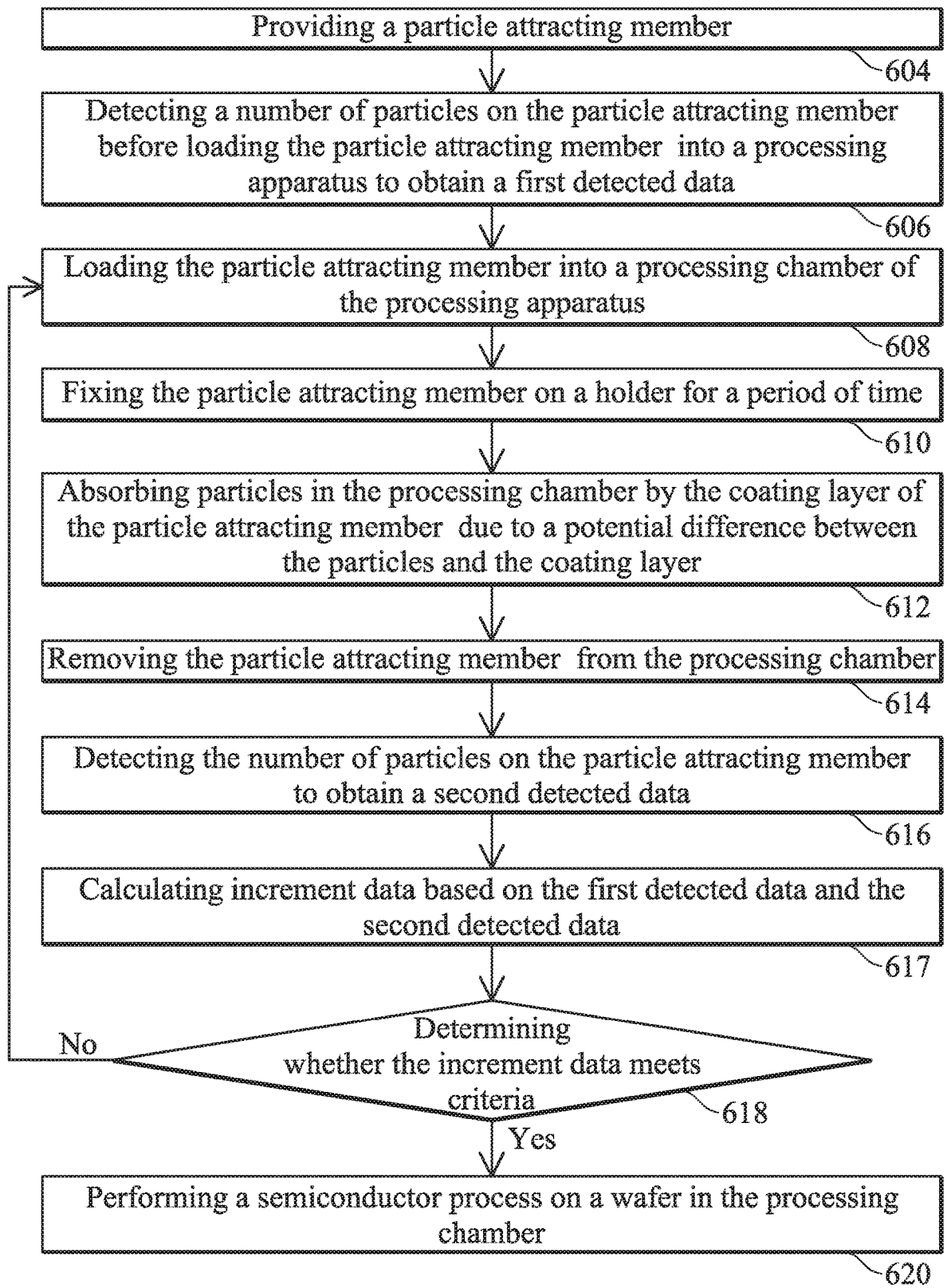
FIG. 6 is a flowchart of a particle removal method according to some embodiments of the present disclosure.

Please refer to FIG. 6, which is a flowchart of a particle removal method 600 according to some embodiments of the present disclosure. The method 600 includes operation 604 in which a particle attracting member (for example, the particle attracting member DW shown in FIG. 2, 3A, 3B, 4A, 4B, 5A, 5B or 5C described above) to be loaded into a semiconductor processing apparatus 60 (see FIG. 1) to remove particles is provided. The particle attracting member DW may include a coating layer CL formed on a surface thereof, and the coating layer CL can be formed by Plasma Enhanced Atomic Layer Deposition (PEALD) technology, but it is not limited thereto. Other suitable deposition processes can also be used in different embodiments. The thickness of the coating layer CL may be about 140 to about 210 Å, and the deposition pressure for forming the coating layer may be about 1800 to about 2000 mTorr, but it is not limited thereto. Other thicknesses of the coating layer CL and/or other suitable deposition pressures can also be used. In some embodiments, the coating layer CL may include a Titanium dioxide ($TiO_2$) film, an Oxide thin film or a Nitric thin film, or a combination thereof. In some embodiments, a Titanium dioxide ($TiO_2$) film, and one of an Oxide thin film and a Nitric thin film are formed on different regions of the outer surface of the particle attracting member DW. That is, the coating layer CL in different regions of the particle attracting member DW may include different materials.

The method 600 also includes operation 606 in which the number of particles on the particle attracting member DW is detected by a particle detecting apparatus (for example, the particle detecting apparatus shown in FIG. 1) to obtain a first detected data, before loading the particle attracting member DW into the semiconductor processing apparatus 60. In some embodiments, the first detected data includes a detected value A1 and a detected value A2. The detected value A1 represents the number of particles with a diameter less than about 0.3 and the detected value A2 represents the number of particles with a diameter greater than about 0.5 In cases where the particle attracting member DW is used for the first time to remove particles from the processing chamber 65 of semiconductor processing apparatus 60, both the detected value A1 and the detected value A2 of the first detected data are 0.

In addition, the method 600 also includes operation 608 in which the particle attracting member DW is loaded into the processing chamber 65 of the semiconductor processing apparatus 60 so as to perform a cleaning cycle in operations 610 and 612 described below. In some embodiments, after receiving the first detected data from the particle detecting apparatus 70, the monitoring device 80 controls the transferring device 40 to transfer the particle attracting member DW from the particle detecting apparatus 70 to one loading port 61 of the semiconductor processing apparatus 60, and then controls the transferring module 63 to transfer the particle attracting member DW onto the wafer holder 66 of the processing chamber 65, as shown in FIG. 1.

In operation 610, the particle attracting member DW is fixed on the wafer holder 66 for a preset period of time, such as about two seconds to about one hour, but it is not limited thereto. In operation 612, as shown in FIG. 2, when the particle attracting member DW is fixed on the wafer holder 66, some particles PT with a first potential in the chamber 65 can be attracted by the coating layer CL with a second potential due to the potential difference between the particles PT and the coating layer CL. In some embodiments, the first potential, such as about 0.5 electron-volts (EV), is higher than the second potential, such as about 0.04 EV. As such, some particles PT having the first potential in the chamber 65 are attracted on the surface of the coating layer CL having the second potential.

Moreover, when the particle attracting member DW is fixed on the wafer holder 66, as shown in FIG. 1 and FIG. 2, the monitoring device 80 may control the airflow device 68 to provide an airflow in the processing chamber 65 to blow some particles toward the particle attracting member DW, in some embodiments. For example, the airflow device 68 can provide airflow to the electron-beam inspection module 67, and the increased airflow loosens the particles that accumulate or adhere to the electron-beam inspection module 67, causing them to fall on the particle attracting member DW, which will be removed from the processing chamber 65 later. As a result, the effect of cleaning the electron-beam inspection module 67 is achieved, and the cleanliness of the entire processing chamber 65 is also improved.

The method 600 also includes operation 614 in which the particle attracting member DW with the particles attracted is removed from the processing chamber 65, for example, by the transferring module 63, after the preset period of time (it is also referred to as the clean cycle). The method 600 also includes operation 616 in which the number of particles on the particle attracting member DW is detected by the particle detecting apparatus 70 again after removing the particle attracting member DW from the processing chamber 65 by the transferring module 63 and transferring the particle attracting member DW from the semiconductor processing apparatus 60 to the particle detecting apparatus 70 by the transferring device 40, and therefore a second detected data is obtained. The second detected data includes a detected value B1 and a detected value B2. The detected value B1 represents the number of particles with a diameter less than about 0.3 μm, and the detected value B2 represents the number of particles with a diameter greater than about 0.5 μm.

The method 600 also includes operation 617 in which increment data are calculated by the monitoring device 80 based on the first detected data obtained in operation 606 and the second detected data obtained in operation 616. The increment data includes a first increment value C1 and a second increment value C2. The first increment value C1 is a difference between the detected value A1 (of the first detected data) and detected value B1 (of the second detected data), i.e., the difference between the initial particle count and the post-cleaning particle count for particles with a diameter less than about 0.3 The second increment value C2 is a difference between the detected value A2 (of the first detected data) and detected value B2 (of the second detected data), i.e., the difference between the initial particle count and the post-cleaning particle count for particles with a diameter greater than about 0.5 μm.

The method 600 also includes operation 618 in which the monitoring device 80 determines whether the increment data obtained in operation 617 meets preset criteria (i) as follows:
(i) The first increment value C1 is less than or equal to 1, and the second increment value C2 is equal to zero.

It should be appreciated that this preset criteria (i) requires that for particles with a diameter less than about 0.3 μm, the count has no increase or the increase cannot exceed 1; and for particles with a diameter greater than about 0.5 the count has no increase.

In operation 618, when the monitoring device 80 determines that the increment data meets the preset criteria (i), it determines that the processing chamber 65 is clean. The monitoring device 80 then controls the transferring device 40 (as well as the transferring module 63) to provide a semiconductor wafer W different from the particle attracting member DW into the processing chamber 65 to perform a semiconductor process (such as an inspection procedure in some embodiments as shown in FIG. 1) on the semiconductor wafer W, in operation 620 as illustrated in FIG. 6. Since particles in the processing chamber 65 have been effectively removed by particle attracting member DW, the possibility of defects on the processed semiconductor wafer W can be reduced. Therefore, the yield rate of the semiconductor process performed by the semiconductor processing apparatus 60 is improved.

In operation 618, when the monitoring device 80 determines that the increment data does not meet the preset criteria (i), it determines that the processing chamber 65 needs to be cleaned again. Then, the flow of the method 600 returns to operation 606 and repeats operations 606 to 618, until in operation 618 the monitoring device 80 determines that the increment data meets the preset criteria (i). For example, in cases where the monitoring device 80 determines that the processing chamber 65 needs to be cleaned again, the monitoring device 80 controls the transferring device 40 (as well as the transferring module 63) to transfer the particle attracting member DW into the processing chamber 65 again for cleaning the processing chamber 65 (i.e., attracting and removing particles using the coating layer CL of the particle attracting member DW).

It should be noted that some operations of method 600 can be performed together, or some operations can be omitted in some embodiments. In addition, the above method embodiments are merely illustrative, and many variations and/or modifications can be made to embodiments of the disclosure. For example, other criteria can be used in operation 618 to determine whether the processing chamber is clean enough.

Figure 7:
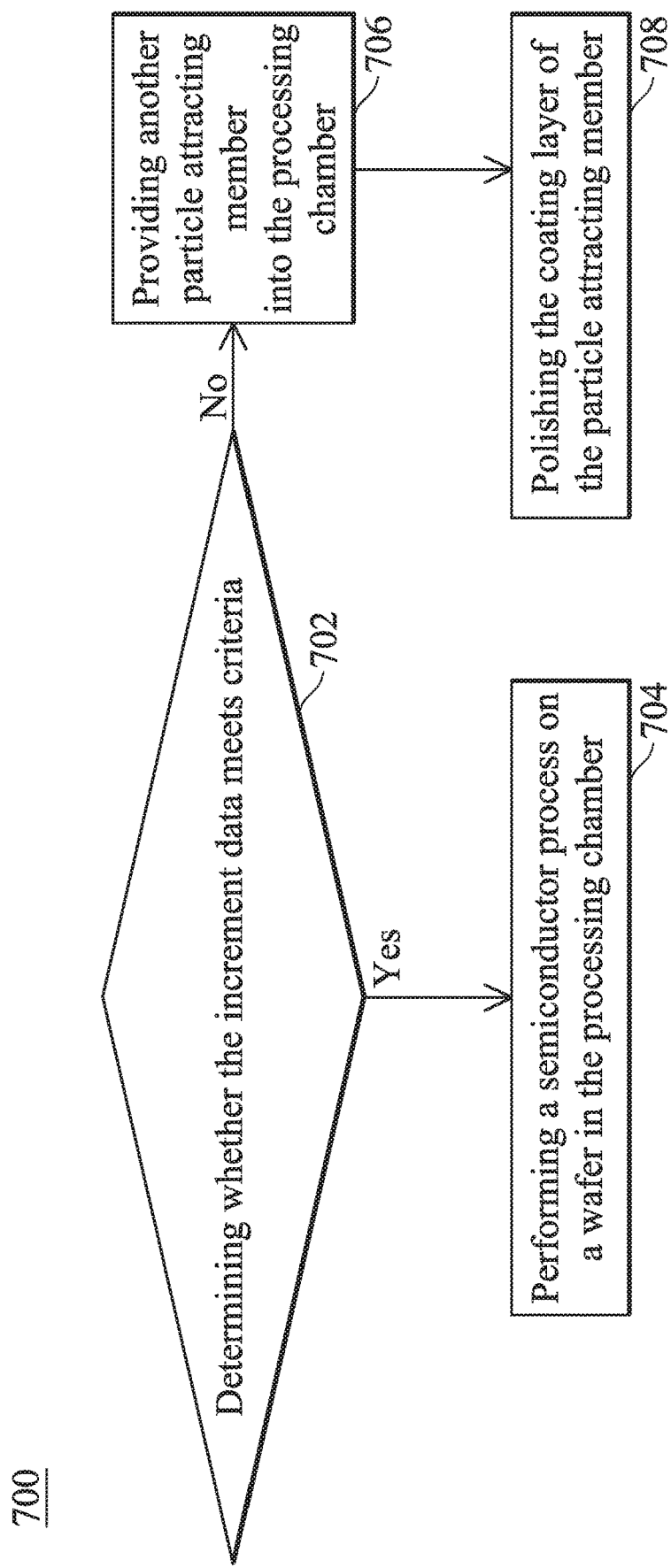
FIG. 7 is a flowchart of a particle removal method according to some embodiments of the present disclosure.

Please refer to FIG. 7, which is a flowchart of another particle removal method 700 according to some embodiments of the present disclosure. The method 700 may be performed after operation 617 illustrated in FIG. 6, but it is not limited thereto. The particle removal method 700 includes operation 702, in which the monitoring device 80 determines whether the increment data meets the preset criteria (i) illustrated in operation 618 of FIG. 6.

When the monitoring device 80 determines that the increment data meets the preset criteria (i), i.e., the processing chamber 65 is clean, operation 704 is performed. In operation 704, the monitoring device 80 controls the transferring device 40 (as well as the transferring module 63) to provide a semiconductor wafer W different from the particle attracting member DW into the processing chamber 65 to perform a semiconductor process, similar to operation 620 of FIG. 6 described above. On the other hand, when the monitoring device 80 determines that the increment data does not meet the criteria (i), operation 706 is performed. In operation 706, the monitoring device 80 controls the transferring device 40 (as well as the transferring module 63) to provide another particle attracting member DW (i.e., the second one) into the processing chamber 65 for removing particles by attraction of the coating layer CL of the second one particle attracting member DW.

The method 700 also includes operation 708. In operation 708, a polishing process is performed on the first one particle attracting member DW for example, by an polishing apparatus (e.g., a CMP apparatus, not shown in the figures), so as to polish and remove the dirty coating layer CL of the first one particle attracting member DW. As a result, the polished particle attracting member DW can be reused. For example, a new coating layer CL may be formed on the polished particle attracting member DW for use in a subsequent cleaning cycle, for example, after a batch of semiconductor wafers W are processed by the semiconductor processing apparatus 60 in a normal wafer processing cycle and before the next batch of semiconductor wafers W to be processed are loaded into the semiconductor processing apparatus 60.

Figure 8:
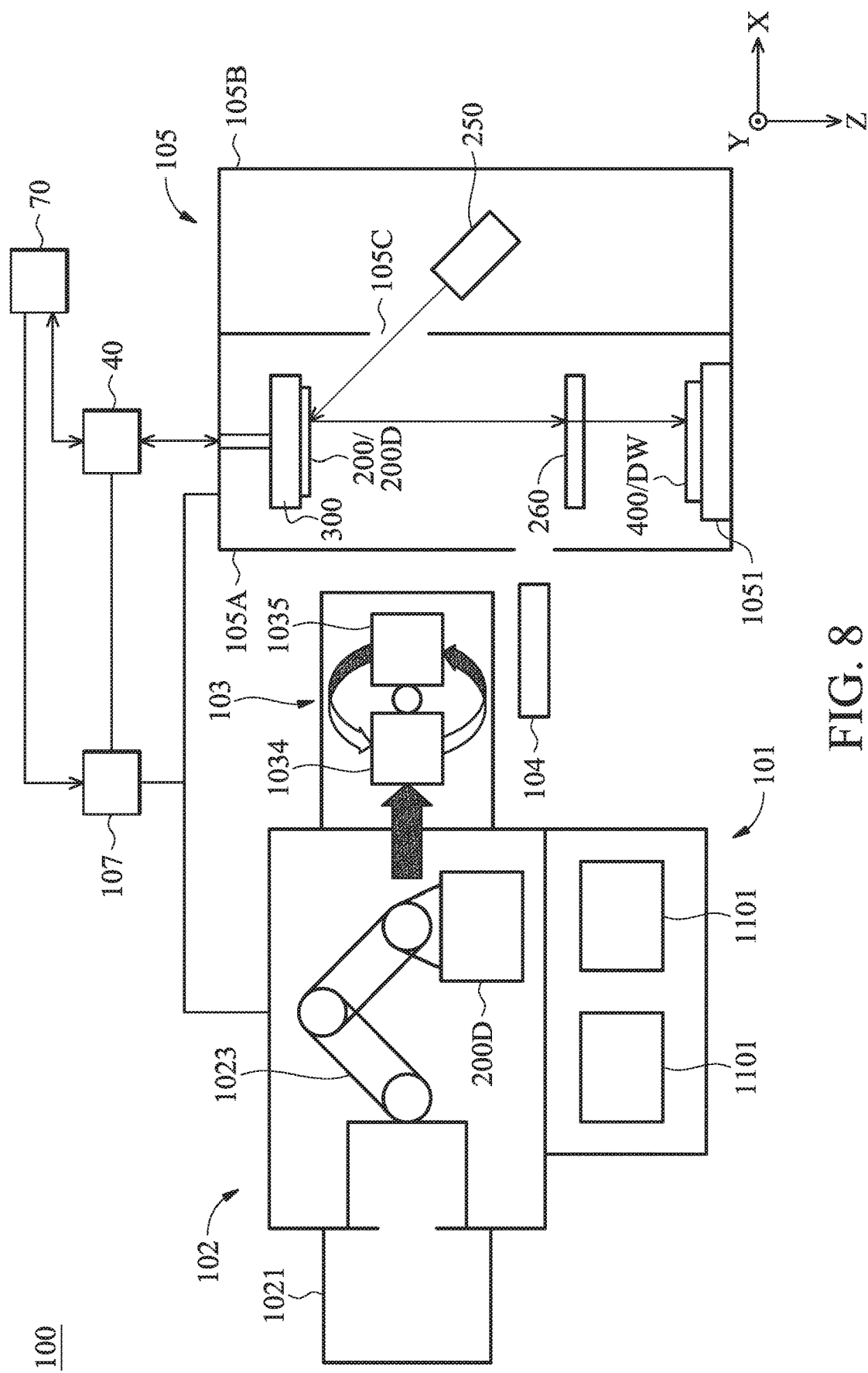
FIG. 8 shows a schematic view of a semiconductor manufacturing system according to some embodiments of the present disclosure.

FIG. 8 shows a schematic view of a semiconductor manufacturing system 100 according to some embodiments of the present disclosure. In some embodiments, the semiconductor manufacturing system 100 includes one or more load ports 101, a transferring module 102, a switching module 103, a transferring module 104, a processing apparatus 105, a control module 107, a transferring device 40 and a particle detecting apparatus 70. The transferring device 40 and the particle detecting apparatus 70 in FIG. 8 embodiments may be similar or the same as the transferring device 40 and the particle detecting apparatus 70 illustrated in FIG. 1, and thus the description is not repeated herein. Elements of the semiconductor manufacturing system 100 can be added to or omitted, and the invention should not be limited by the embodiments. In some embodiments, the semiconductor manufacturing system 100 may be a lithography processing system and the processing apparatus 105 is a lithography apparatus. The semiconductor manufacturing system 100 is configured to use a high-brightness light to expose a photoresist layer coated on the semiconductor wafer. The semiconductor manufacturing system 100 may be generically referred to as a scanner that is operable to perform lithography exposure process with respective high-brightness light source and exposure mode.

In some embodiments, the semiconductor manufacturing system 100 further includes a reticle 200 (or photomask) which is to be located in the processing apparatus 105. The load ports 101 are configured to load a reticle 200 from a carrier 1011 into the transferring module 102 or remove a reticle 200 from the transferring module 102 to the carrier 1011. In some embodiments, the load ports 101 are able to place two carriers 1011, but the number of the carriers is not limited thereto. In this embodiment, one of the two carriers 1011 is used to carry the reticle 200 which are going to be transported into the transferring module 102, and another one is used to carry another reticle 200 which are removed from the transferring module 102.

In the present embodiment, the reticle 200 is a reflective reticle. One exemplary structure of the reticle 200 includes a substrate with a suitable material, such as a low thermal expansion material (LTEM) or fused quartz. In various examples, the LTEM includes TiO2 doped SiO2, or other suitable materials with low thermal expansion. The reticle 200 includes a reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The reticle 200 may further include a capping layer, such as ruthenium (Ru), disposed on the reflective multilayer for protection. The reticle 200 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift reticle.

In some embodiments, the load ports 101 are also configured to load a particle attracting member 200D for removing particles (which will be described later) into the semiconductor manufacturing system 100, as shown in FIG. 8. The particle attracting member 200D has a similar structure to the reticle 200, except that the particle attracting member 200D further has a thin film, such as a coating layer for attracting particles, formed on a surface thereof. The materials, configuration and/or the formation method of the coating layer of the particle attracting member 200D are similar or the same as those of the coating layer CL of the particle attracting member DW illustrated in FIGS. 2 to 5.

The transferring module 102 is configured to deliver the reticle 200 (or the particle attracting member 200D) between the load port 101 and the switching module 103. In some embodiments, the transferring module 102 is positioned between the load port 101 and the switching module 103. The transferring module 102 may include a control circuit 1021 and a robotic arm 1023. The control circuit 1021 is configured to generate an electrical signal to the robotic arm 1023, so as to control the robotic arm 1023 to deliver the reticle 200 (or the particle attracting member 200D). In some embodiments, the robotic arm 1023 may include a six-axis robot manipulator and is configured for grapping the reticle 200 (or the particle attracting member 200D).

The switching module 103 is configured for gripping the reticle 200 (or the particle attracting member 200D) before the reticle 200 (or the particle attracting member 200D) is moved to the transferring module 104 and after another reticle 200 (or another particle attracting member 200D) is removed from the transferring module 104. Two carrier heads 1034 and 1035 of the switching module 103 are configured to grip the reticle 200 (or the particle attracting member 200D) by suitable means. For example, the two carrier heads 1034 and 1035 are connected to a vacuum source, and the reticle 200 (or the particle attracting member 200D) are mounted on the bottom surfaces of the two carrier heads 1034 and 1035 by the vacuum. However, it should be noted that many variations and modifications can be made to embodiments of the disclosure. In some embodiments, the transferring module 104 is a transportation stage configured to transfer the reticle 200 (or the particle attracting member 200D) between the switching module 103 and the processing apparatus 105.

In some embodiments, the control module 107 is configured to control the operation of devices of the semiconductor manufacturing system 100. In some embodiments, the control module 107 may operate like the monitoring device 80 in FIG. 1 (i.e., the control module 107 may also be called a monitoring device). In some embodiments, the control module 107 can be a computer that communicates with the variant devices and elements of the semiconductor manufacturing system 100 by a wired or wireless communication network. For example, the control module 107 is electrically connected to the switching module 103 and the transferring module 104, and the operation of the switching module 103 and the transferring module 104 is controlled by the control module 107. In addition, the control module 107 and the control circuit 1021 can be integrated into a control unit.

As shown in FIG. 8, the processing apparatus 105 can include a lithography chamber 105A and a light source chamber 150B, and the lithography chamber 105A is communicated to the light source chamber 150B through a valve 105C. The lithography chamber 105A can include a reticle stage 300, a wafer stage 1051 and a projection optics module 260 (or projection optics box (POB)). The reticle stage 300 may include a holder to be configured to receive and hold the reticle 200 (or the particle attracting member 200D) transferred by the transferring module 104 from the switching module 103. The wafer stage 1051 may include a holder to be configured to receive and hold a semiconductor wafer 400 transferred by a transferring module (not shown in FIG. 8) from a wafer loading port (not shown in FIG. 8). The transferring module and the wafer loading port may be similar or the same as the transferring module 63 and the loading port 61 illustrated in FIG. 1, and the description is not repeated herein.

In some embodiments, a light source 250 is disposed in the light source chamber 150B and can generate an Extreme Ultraviolet (EUV) light during the lithography exposure process. The EUV light travels through the valve 105C and reflected by the reticle 200 secured on the reticle stage 300 onto the semiconductor wafer 400 secured on the wafer stage 1051, so as to define a pattern of the reticle 200 (photomask) on the semiconductor wafer 400. The projection optics module 260 is disposed on the path through which the EUV light travels. For example, the projection optics module 260 is disposed between the reticle 200 and the semiconductor wafer 400 in these embodiments as shown in FIG. 8, but it is not limited thereto. The light source 250 is configured to generate radians having a wavelength ranging between about 1 nm and about 100 nm. In one particular example, the high-brightness light source generates an EUV light with a wavelength centered at about 13.5 nm. Accordingly, the light source 250 is also referred to as EUV light source. In another embodiment, the projection optics module 260 can also be disposed between the reticle 200 and the light source 250. The light generated by the light source 250 is not limited to EUV light. The light source 250 can be utilized to perform any high-intensity photon emission from excited target material. For example, the light source 250 may include a high-brightness light source, such as an ultraviolet (UV) source or a deep ultraviolet (DUV) source.

When particles are present in the lithography chamber 105A, undesired defects may occur on the semiconductor wafer 400 in the lithography exposure process. To this end, in some embodiments, the control module 107 can determine whether the lithography chamber 105A needs to be clean. For example, a particle attracting member DW (similar to the particle attracting member DW illustrated in FIGS. 2 to 5) may be loaded into the lithography chamber 105A in a similar manner to the semiconductor wafer 400 and placed on the wafer stage 1051 for a period of time, before loading a semiconductor wafer 400 into the lithography chamber 105A for lithography exposure processing. The particle attracting member DW can then be removed from the lithography chamber 105A and transferred, by the transferring device 40, to the particle detecting apparatus 70 for detecting the number of particles on the particle attracting member DW. Accordingly, the control module 107 can determine whether the lithography chamber 105A needs to be cleaned according to the detection result of the particle detecting apparatus 70, similar to the method 600 illustrated in FIG. 6. However, embodiments of the disclosure are not limited to the above particle detection method, and other suitable particle detection methods can also be used.

In some embodiments, when the control module 107 determines that the lithography chamber 105A needs to be cleaned, the control module 107 may control the transferring module 102, the switching module 103 and the transferring module 104 to transfer a particle attracting member 200D onto the reticle stage 300 in the lithography chamber 105A, and/or control the transferring device 40 (as well as the transferring module, not shown in the figure) to transfer the previous particle attracting member DW or a new one particle attracting member DW onto the wafer stage 1051 in the lithography chamber 105A so as to perform a cleaning cycle for removing particles in the lithography chamber 105A (described below).

After arranging the particle attracting member 200D and/or the particle attracting member DW in the lithography chamber 105A, the control module 107 controls the valve 105C to be closed and to maintain the lithography chamber 105A in a vacuum state. In some embodiments embodiment, the particle attracting member is fixed on the wafer stage 1051 and/or the particle attracting member 200D is fixed on the reticle stage 300 for a period of time, so that particles in the lithography chamber 105A may be attracted by the coating layer of the particle attracting member 200D and/or by the coating layer of the particle attracting member DW due to a potential difference between the coating layers and the particles. In some other embodiments, only one of the particle attracting member DW and the particle attracting member 200D is used for removing particles from the lithography chamber 105A.

As a result, in FIG. 8, particles in the lithography chamber 105A may also be cleaned more quickly so as to shorten the time required for cleaning the lithography chamber 105A, similar to the embodiments discussed above.

Embodiments of the present disclosure can provide a semiconductor manufacturing system and particle removing methods for cleaning particles in the processing chamber of the semiconductor manufacturing system used in the semiconductor manufacturing process. Based on the above design, the particles in the processing chamber of the semiconductor manufacturing system can be easily removed using a particle attracting member with a coating layer due to the potential difference between the particles and the coating layer, during a cleaning cycle different from (e.g., before) normal wafer processing cycle, without shutting down the processing apparatus to allow the operator to manually clean the processing chamber. Therefore, the time required for removing the particles from the processing chamber can be greatly reduced. For example, the time required for removing the particles can be reduced from about 72 hours to less than about 1 hour using the particle attracting member.

In addition, in some embodiments, the semiconductor manufacturing system may also utilize two particle attracting members each with a coating layer (one may be fixed on the wafer stage, and the other may be fixed on the reticle stage) to clean the processing chamber in the vacuum state, during a cleaning cycle different from (e.g., before) normal wafer processing cycle, so that particles in the processing chamber may be removed more quickly so as to shorten the time required for cleaning.

According to some embodiments, a semiconductor manufacturing system is provided. The semiconductor manufacturing system includes a semiconductor processing apparatus including a processing chamber configured to perform a semiconductor process on a semiconductor wafer, and a transferring module configured to transfer the semiconductor wafer into and out of the processing chamber. The semiconductor manufacturing system also includes a particle attracting member with a coating layer. In addition, the semiconductor manufacturing system includes a monitoring device configured to control the transferring module to load the particle attracting member into the processing chamber in a cleaning cycle while the semiconductor wafer is not in the processing chamber, and control the transferring module to load the particle attracting member out of the processing chamber after the cleaning cycle. In the cleaning cycle, particles in the processing chamber are attracted to the surface of the coating layer of the particle attracting member due to a potential difference between the coating layer and the particles.

According to some embodiments, a particle removal method is provided, which includes loading a particle attracting member with a coating layer into a processing chamber of a processing apparatus. The method also includes fixing the particle attracting member on a holder in the processing chamber in a cleaning cycle. The method also includes attracting particles in the processing chamber by the coating layer of the particle attracting member due to a potential difference between the particles and the coating layer. The particles are attracted to the surface of the coating layer. The method further includes loading the particle attracting member with the coating layer and the attracted particles out of the processing chamber, after the cleaning cycle. In addition, the method includes loading a semiconductor wafer into the processing chamber, and performing a semiconductor process on the semiconductor wafer in the processing chamber. The semiconductor process is performed after the cleaning cycle.

According to some embodiments, a particle removal method is provided, which includes providing a first particle attracting member with a first coating layer. The method also includes detecting the number of particles on the first coating layer to obtain a first detected value. The method also includes loading the first particle attracting member into a processing chamber of a processing apparatus, after obtaining the first detected value. The method also includes fixing the first particle attracting member on a holder in the processing chamber in a cleaning cycle. The method also includes attracting particles in the processing chamber by the first coating layer of the first particle attracting member due to a potential difference between the particles and the first coating layer. The method further includes loading the first particle attracting member with the first coating layer and the attracted particles out of the processing chamber, after the cleaning cycle. The method further includes detecting the number of the particles on the first coating layer of the first particle attracting member to obtain a second detected value, after loading the first particle attracting member out of the processing chamber. The method further includes calculating the difference between the first detected value and the second detected value. In addition, the method includes loading a semiconductor wafer into the processing chamber and performing a semiconductor process on the semiconductor wafer, when the difference between the first detected value and the second detected value is smaller than or equal to a preset value.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A particle removal method, comprising:
   loading a particle attracting member with a coating layer into a processing chamber of a processing apparatus;
   fixing the particle attracting member on a holder in the processing chamber in a cleaning cycle;
   attracting particles in the processing chamber by the coating layer of the particle attracting member due to a potential difference between the particles and the coating layer, wherein the particles are attracted to a surface of the coating layer;
   loading the particle attracting member with the coating layer and the attracted particles out of the processing chamber, after the cleaning cycle;
   loading a semiconductor wafer into the processing chamber; and
   performing a semiconductor process on the semiconductor wafer in the processing chamber, wherein the semiconductor process is performed after the cleaning cycle.

2. The particle removal method as claimed in claim 1, further comprising:
   determining whether the processing chamber is clean enough for the semiconductor process for the semiconductor wafer based on a number of the particles attracted to the coating layer, before loading the semiconductor wafer into the processing chamber.

3. The particle removal method as claimed in claim 2, wherein the determining comprises:
   before loading the particle attracting member into the processing chamber, detecting the number of particles with a specific diameter on the coating layer of the particle attracting member by optical detection to obtain a first detected value;
   after loading the particle attracting member out of the processing chamber, detecting the number of the particles with the specific diameter on the coating layer of the particle attracting member by optical detection to obtain a second detected value; and
   calculating a difference between the first detected value and the second detected value.

4. The particle removal method as claimed in claim 3, further comprising:
   loading the semiconductor wafer into the processing chamber and performing the semiconductor process on the semiconductor wafer, when the difference between the first detected value and the second detected value is smaller than or equal to a preset value.

5. The particle removal method as claimed in claim 1, further comprising:
   providing an airflow in the processing chamber to blow some particles toward the coating layer of the particle attracting member in the cleaning cycle.

6. The particle removal method as claimed in claim 1, wherein the coating layer includes a Titanium dioxide ($TiO_2$) film, an Oxide thin film or a Nitric thin film.

7. The particle removal method as claimed in claim 1, wherein the particle attracting member is fixed on the holder in the processing chamber in the cleaning cycle while the processing chamber is in a vacuum state, and the processing apparatus does not shut down when loading the particle attracting member into and out of the processing chamber.

8. A particle removal method, comprising:
providing a first particle attracting member with a first coating layer;
detecting a number of particles on the first coating layer to obtain a first detected value;
loading the first particle attracting member into a processing chamber of a processing apparatus, after obtaining the first detected value;
fixing the first particle attracting member on a holder in the processing chamber in a cleaning cycle;
attracting particles in the processing chamber by the first coating layer of the first particle attracting member due to a potential difference between the particles and the first coating layer;
loading the first particle attracting member with the first coating layer and the attracted particles out of the processing chamber, after the cleaning cycle;
detecting the number of the particles on the first coating layer of the first particle attracting member to obtain a second detected value, after loading the first particle attracting member out of the processing chamber;
calculating a difference between the first detected value and the second detected value; and
loading a semiconductor wafer into the processing chamber and performing a semiconductor process on the semiconductor wafer, when the difference between the first detected value and the second detected value is smaller than or equal to a preset value.

9. The particle removal method as claimed in claim 8, further comprising:
loading a second particle attracting member with a second coating layer into the processing chamber to attract the particles in the processing chamber by the second coating layer, when the difference between the first detected value and the second detected value is greater than the preset value.

10. The particle removal method as claimed in claim 8, further comprising:
polishing the first coating layer of the first particle attracting member after loading the first particle attracting member out of the processing chamber;
providing a second particle attracting member by forming a second coating layer on the polished first particle attracting member; and
loading the second particle attracting member with the second coating layer into the processing chamber to attract the particles in the processing chamber by the second coating layer.

11. The particle removal method as claimed in claim 8, wherein the number of the particles on the first coating layer is detected by optical detection.

12. The particle removal method as claimed in claim 11, wherein the particles are attracted to a surface of the first coating layer.

13. The particle removal method as claimed in claim 8, wherein in the cleaning cycle, no semiconductor process is performed on the first particle attracting member in the processing chamber.

14. A particle removal method, comprising:
providing a particle attracting member with a coating layer;
detecting a number of particles on the coating layer to obtain a first detected value;
loading the particle attracting member into a processing chamber of a processing apparatus, after obtaining the first detected value;
fixing the particle attracting member on a holder in the processing chamber in a cleaning cycle;
attracting particles in the processing chamber by the coating layer of the particle attracting member due to a potential difference between the particles and the coating layer, in the cleaning cycle;
loading the particle attracting member with the coating layer and the attracted particles out of the processing chamber, after the cleaning cycle;
detecting the number of the particles on the coating layer of the particle attracting member to obtain a second detected value, after loading the particle attracting member out of the processing chamber;
calculating a difference between the first detected value and the second detected value; and
loading a semiconductor wafer into the processing chamber and performing a semiconductor process on the semiconductor wafer, when the difference between the first detected value and the second detected value is smaller than or equal to a preset value, wherein the semiconductor wafer is fixed on the holder during the semiconductor process.

15. The particle removal method as claimed in claim 14, wherein the number of the particles on the coating layer is detected by optical detection.

16. The particle removal method as claimed in claim 14, wherein the particles are attracted to a surface of the coating layer.

17. The particle removal method as claimed in claim 14, wherein the processing chamber is in a vacuum state in the cleaning cycle, and the processing apparatus does not shut down when loading the particle attracting member into and out of the processing chamber.

18. The particle removal method as claimed in claim 14, further comprising:
providing an airflow in the processing chamber to blow some particles toward the coating layer of the particle attracting member in the cleaning cycle.

19. The particle removal method as claimed in claim 14, wherein the coating layer includes a Titanium dioxide ($TiO_2$) film, an Oxide thin film or a Nitric thin film.

20. The particle removal method as claimed in claim 14, wherein in the cleaning cycle, no semiconductor process is performed on the particle attracting member in the processing chamber.

* * * * *